(12) United States Patent
Nakayama

(10) Patent No.: US 10,249,676 B2
(45) Date of Patent: Apr. 2, 2019

(54) IMAGE PICKUP APPARATUS

(71) Applicant: OLYMPUS CORPORATION, Tokyo (JP)

(72) Inventor: Takashi Nakayama, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/783,616

(22) Filed: Oct. 13, 2017

(65) Prior Publication Data
US 2018/0040659 A1 Feb. 8, 2018

Related U.S. Application Data

(63) Continuation of application No. PCT/JP2015/061865, filed on Apr. 17, 2015.

(51) Int. Cl.
*H01L 31/00* (2006.01)
*H01L 27/146* (2006.01)
(Continued)

(52) U.S. Cl.
CPC ........ *H01L 27/14636* (2013.01); *H01L 24/02* (2013.01); *H01L 24/13* (2013.01);
(Continued)

(58) Field of Classification Search
CPC ... H01L 27/14636; H01L 24/13; H01L 24/14; H01L 24/16; H01L 24/17; H01L 24/02; H01L 27/14; H01L 2224/02372; H01L 2224/17517; H01L 2224/02375; H01L 2224/02377; H01L 2224/02; H04N 5/2257; H04N 5/2253
(Continued)

(56) References Cited

U.S. PATENT DOCUMENTS

2011/0199473 A1* 8/2011 Kojima ............... A61B 1/05
348/76
2013/0214375 A1* 8/2013 Dai ................ H01L 27/14618
257/459

FOREIGN PATENT DOCUMENTS

JP H09-056671 A 3/1997
JP 2013-123628 A 6/2013
(Continued)

OTHER PUBLICATIONS

International Search Report dated Jun. 30, 2015 issued in PCT/JP2015/061865.

*Primary Examiner* — Vu A Vu
(74) *Attorney, Agent, or Firm* — Scully, Scott, Murphy & Presser, P.C.

(57) ABSTRACT

An image pickup apparatus includes: an image pickup device including a light receiving surface, an opposite surface, and an inclined surface, and provided with light receiving surface electrodes formed on the light receiving surface; cover glass joined so as to cover the light receiving surface; and a wiring board including second bond electrodes, wherein back surfaces of the light receiving surface electrodes being exposed to an opposite surface side, extended wiring patterns extended from the respective back surfaces of the light receiving surface electrodes through the inclined surface to the opposite surface, each of the extended wiring patterns including a first bond electrode, and the first bond electrode and the second bond electrode being bonded through a bump.

7 Claims, 4 Drawing Sheets

(51) Int. Cl.
*H01L 27/14* (2006.01)
*H01L 23/00* (2006.01)
*H04N 5/225* (2006.01)

(52) U.S. Cl.
CPC .............. *H01L 24/14* (2013.01); *H01L 24/16* (2013.01); *H01L 24/17* (2013.01); *H01L 27/14* (2013.01); *H04N 5/2253* (2013.01); *H04N 5/2257* (2013.01); *H01L 2224/02371* (2013.01); *H01L 2224/02372* (2013.01); *H01L 2224/02373* (2013.01); *H01L 2224/02375* (2013.01); *H01L 2224/02377* (2013.01); *H01L 2224/02381* (2013.01); *H01L 2224/13024* (2013.01); *H01L 2224/14131* (2013.01); *H01L 2224/14153* (2013.01); *H01L 2224/16227* (2013.01); *H01L 2224/17517* (2013.01)

(58) Field of Classification Search
USPC .................................................. 257/433, 459
See application file for complete search history.

(56) References Cited

FOREIGN PATENT DOCUMENTS

| | | |
|---|---|---|
| JP | 2014-075764 A | 4/2014 |
| JP | 2014-094237 A | 5/2014 |
| WO | WO 2014/054419 A1 | 4/2014 |
| WO | WO 2014/065099 A1 | 5/2014 |

* cited by examiner

IMAGE PICKUP APPARATUS

CROSS REFERENCE TO RELATED APPLICATION

This application is a continuation application of PCT/JP2015/061865 filed on Apr. 17, 2015, the entire contents of which are incorporated herein by this reference.

BACKGROUND OF THE INVENTION

1. Field of the Invention

The present invention relates to an image pickup apparatus including an image pickup device in which a plurality of electrodes electrically connected with a light receiving portion are lined up, and a wiring board in which a plurality of wires bonded with each of the plurality of electrodes of the image pickup device are lined up.

2. Description of the Related Art

An image pickup apparatus manufactured by a wafer level CSP technique is small-sized so that the image pickup apparatus greatly contributes to diameter reduction of an endoscope.

In a manufacturing method of the image pickup apparatus of a wafer level CSP type, first, on a light receiving surface of a semiconductor wafer, a plurality of light receiving portions and a plurality of light receiving surface electrodes electrically connected with the respective light receiving portions are formed. The light receiving portion is a pixel area formed of a CMOS (complementary metal oxide semiconductor) image sensor, a CCD (charge coupled device), or the like. A glass wafer is joined to the light receiving surface of the semiconductor wafer and a bond wafer is manufactured. Then, a plurality of through wires reaching an opposite surface opposing the light receiving surface of the bond wafer are formed.

The light receiving surface of an image pickup device obtained by cutting the bond wafer is covered with cover glass. However, since the light receiving portions are connected with electrodes on the opposite surface through the through wires, an electric signal can be transmitted and received.

Japanese Patent Application Laid-Open Publication No. 2014-75764 discloses an image pickup apparatus 101 illustrated in FIG. 1. In the image pickup apparatus 101, instead of the plurality of through wires, a plurality of connection wires are arranged in one through trench 110T.

The image pickup apparatus 101 includes an image pickup device 110 to which cover glass 130 is joined by an adhesive layer 120, a wiring board 140, and a signal cable 150. On the image pickup device 110, the through trench 110T with an inclined wall surface is formed. The cover glass 130 and the adhesive layer 120 are extended to an outer side of an end side of the inclined surface, that is, a bottom surface of the through trench 110T. Since light receiving surface electrodes 112 on a light receiving surface 110SA are extended to the bottom surface of the through trench 110T, back surfaces of the light receiving surface electrodes 112 are exposed to the bottom surface of the through trench 110T. On an inclined wall surface (inclined surface) 110SS of the through trench 110T, a plurality of bond electrodes 114 respectively extended from the bottom surface (right above the light receiving surface electrodes 112) of the through trench 110T are lined up. At the bond electrode 114, a bump 115 is disposed. Note that the inclined surface 110SS is inclined at an acute first inclination angle $\theta 1$ to the light receiving surface 110SA of the image pickup device 110.

Each of the plurality of bond electrodes 114 is bonded with a plurality of first bond electrodes 141 lined up at an end portion of a main surface 140SA of the wiring board 140 through the bump 115. That is, for the wiring board 140, the main surface 140SA is inclined at the first inclination angle $\theta 1$ to an opposite surface 110SB of the image pickup device 110. Then, to a second bond electrode (not illustrated) at the other end portion of the wiring board 140, the signal cable 150 is bonded.

Note that the flexible wiring board 140 and the signal cable 150 are arranged within a projection surface of the image pickup device 110, an outer dimension (plane view dimension) of the image pickup apparatus 101 is a same as an outer dimension of the image pickup device 110.

SUMMARY OF THE INVENTION

An image pickup apparatus in an embodiment of the present invention includes: an image pickup device including a light receiving surface where a light receiving portion is formed, an opposite surface opposing the light receiving surface, and an inclined surface inclined at an acute first angle to the light receiving surface, and provided with a plurality of light receiving surface electrodes electrically connected with the light receiving portion and formed on the light receiving surface; a transparent member joined so as to cover the light receiving surface; and a wiring board including a plurality of second bond electrodes on a main surface, the transparent member and the plurality of light receiving surface electrodes being extended to an outside of an end side of the inclined surface, back surfaces of the plurality of light receiving surface electrodes being exposed to a side of the opposite surface, the image pickup device including a plurality of extended wiring patterns extended from the respective back surfaces of the plurality of light receiving surface electrodes through the inclined surface to the opposite surface, each of the extended wiring patterns including a first bond electrode on the opposite surface, the main surface of the wiring board and the opposite surface of the image pickup device being arranged in parallel, and the first bond electrode and each of the plurality of second bond electrodes being bonded through a bump.

DETAILED DESCRIPTION OF THE PREFERRED EMBODIMENTS

First Embodiment

Hereinafter, an image pickup apparatus 1 in a first embodiment of the present invention will be described with reference to the drawings. Note that the drawings are schematic, and a relation between a thickness and a width of individual members, a ratio of the thicknesses of the respective members, a number of bond electrodes, an array pit, or the like are different from the actual ones. In addition, even between the drawings, a part where the relation of dimensions or the ratio of each other is different is included. Further, for some configurations, for example a silicon oxide layer on a surface of a silicon substrate, wires, or the like, illustrations are omitted. In addition, illustrations of electronic components or the like are sometimes omitted.

Figure 1:
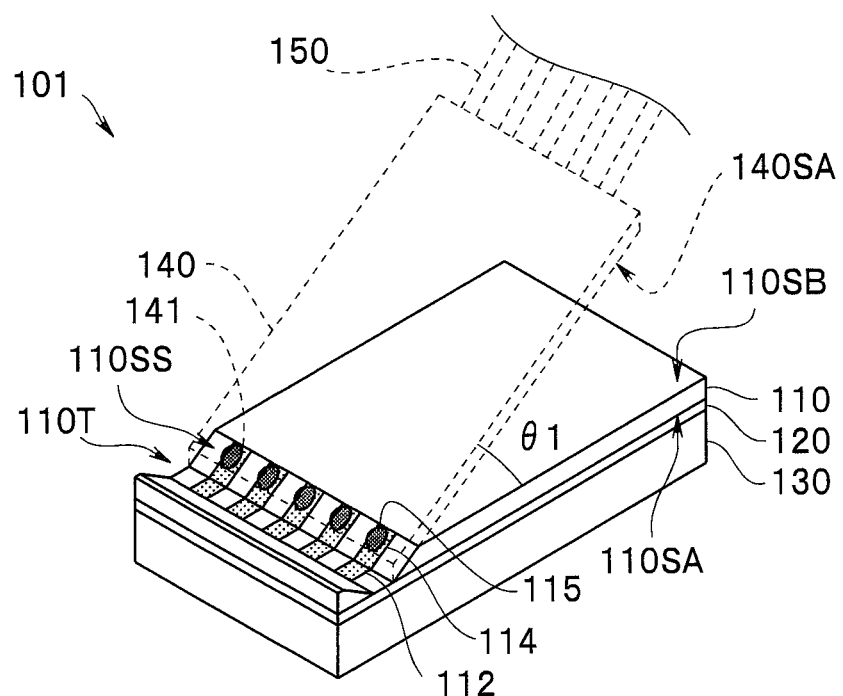
FIG. 1 is a perspective view of a conventional image pickup apparatus.
Figure 2:
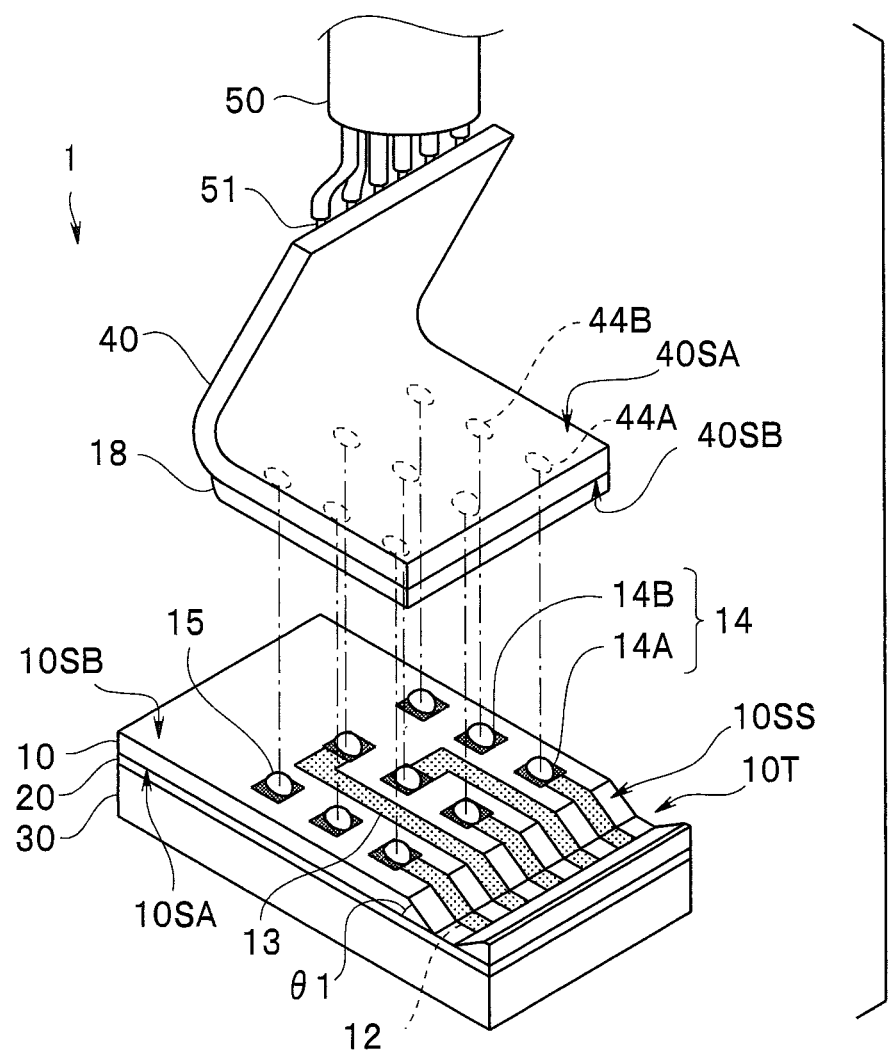
FIG. 2 is an exploded view of an image pickup apparatus in a first embodiment.
Figure 3:
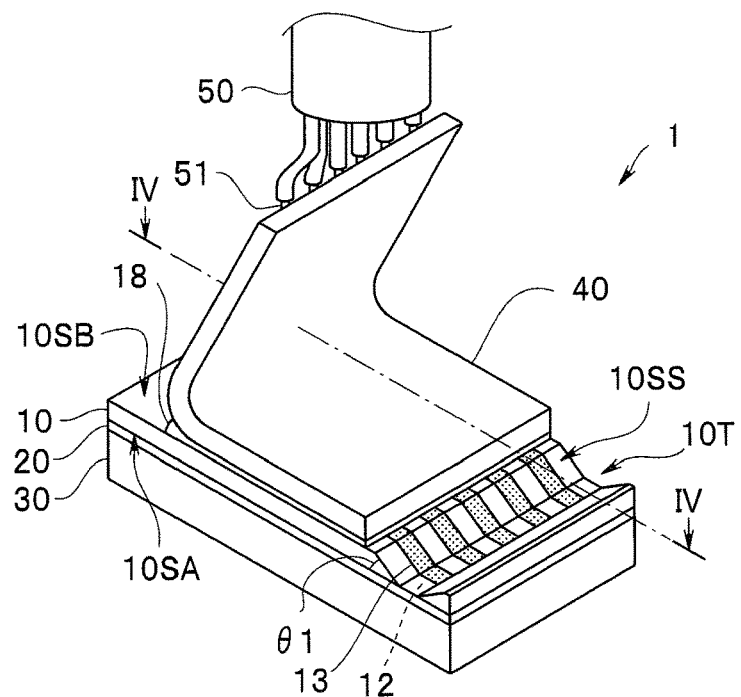
FIG. 3 is a perspective view of the image pickup apparatus in the first embodiment.
Figure 4:
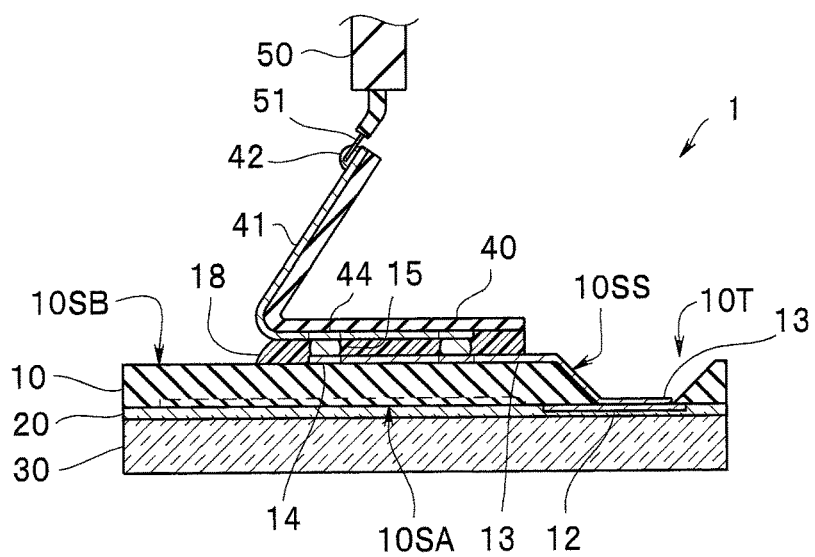
FIG. 4 is a sectional view along a IV-IV line in FIG. 3 of the image pickup apparatus in the first embodiment.

As illustrated in FIG. 2 to FIG. 4, the image pickup apparatus 1 includes an image pickup device 10 formed of a silicon substrate, cover glass 30 which is a transparent member, a wiring board 40, and a signal cable 50. A light receiving surface 10SA of the image pickup device 10 is covered with the cover glass 30 through an adhesive layer 20.

The image pickup device 10 has a configuration similar to the configuration of the image pickup device 110 of an already described conventional image pickup apparatus 101. That is, the image pickup device 10 formed of silicon includes the light receiving surface 10SA where a light receiving portion 11 is formed, an opposite surface 10SB opposing the light receiving surface 10SA, and an inclined surface 10SS inclined at an acute first angle θ1 to the light receiving surface 10SA. On the light receiving surface 10SA, a plurality of light receiving surface electrodes 12 electrically connected with the light receiving portion 11 are lined up.

On the image pickup device 10, a through trench 10T, a wall surface of which is the inclined surface 10SS, is formed. To form the through trench including the inclined surface 10SS, anisotropic etching can be preferably used. As the anisotropic etching, a wet etching method using a tetramethylammonium hydroxide (TMAH) solution, a potassium hydroxide (KOH) solution or the like is desirable, but a dry etching method such as reactive ion etching (RIE) or chemical dry etching (CDE) is also usable.

For example, in a case of using a silicon substrate of a (100) plane for the light receiving surface 10SA as the image pickup device 10, since an etching speed of a (111) plane is lower than the etching speed of the (100) plane in the anisotropic etching, a wall surface of the through trench 10T becomes the (111) plane, and becomes the inclined surface for which an angle θ1 with the (100) plane which is the light receiving surface 10SA is 54.74 degrees.

The cover glass 30, the adhesive layer 20 and the light receiving surface electrodes 12 of the image pickup device 10 are extended to an outer side of an end side of the inclined surface 10SS of the through trench 10T. During manufacture, the light receiving surface electrodes 12 are disposed on the light receiving surface of a silicon wafer to be the image pickup device 10, and a glass wafer to be the cover glass 30 is joined through the adhesive layer 20 onto the light receiving surface electrodes 12. The adhesive layer 20 is formed of a transparent ultraviolet curing type resin for example. Note that a microlens array may be disposed on the light receiving portion 11 and a periphery of the light receiving portion 11 may be joined by the adhesive layer.

The silicon wafer to which the glass wafer is bonded is etched from the side of the opposite surface 105B and removed. Therefore, on a bottom surface of a notch 10TT, on the outer side of the end side of the inclined surface 10SS in other words, a back surface of the light receiving surface electrodes 12 is exposed.

Then, the image pickup device 10 includes extended wiring patterns 13 electrically connected with the light receiving surface electrodes 12, the back surface of which is exposed to the opposite surface side. The extended wiring pattern 13 is disposed from the bottom surface of the through trench 10T through the inclined surface 10SS to the opposite surface 10SB. The extended wiring pattern 13 is formed of a low electric resistance material such as gold, copper or aluminum. Then, at a predetermined position of the extended wiring pattern 13 on the opposite surface 10SB, a first bond electrode 14 is disposed. The first bond electrode 14 may be configured from the same material as the material of the extended wiring pattern 13, or a barrier layer such as a nickel layer/a gold layer may be formed on the extended wiring pattern 13. At the first bond electrode 14, a bump 15 is disposed. The bump 15 is a solder bump, a gold bump or the like formed by a frame plating method or a paste printing method for example.

The wiring board 40 is a flexible wiring board including a plurality of wires 41, for which polyimide is an insulating layer for example. Then, on a second main surface 40SB of the wiring board 40, a plurality of second bond electrodes 44 electrically connected with the wires 41 respectively are disposed. On a first main surface 40SA, an electronic component (not illustrated) such as a chip capacitor is mounted. Note that an electronic component may be mounted also on the second main surface 40SB.

To cable bond electrodes 42 lined up on a rear end portion side of the second main surface 40SB of the wiring board 40, a conducting wire 51 of the signal cable 50 is bonded. The signal cable 50 is also housed within a projection surface of the image pickup device 10. Note that the plurality of cable bond electrodes 42 may be disposed on the second main surface 40SB of the wiring board 40, or may be disposed on the first main surface 40SA and the second main surface 40SB.

The plurality of first bond electrodes 14 and the plurality of second bond electrodes 44 are arranged in a grid pattern so as to respectively oppose each other. Then, the first bond electrodes 14 and the second bond electrodes 44 are bonded through the bumps 15. Through the plurality of bumps 15 arranged in the grid pattern, for the image pickup device 10 and the wiring board 40, the opposite surface 10SB and the second main surface 40SB are fixed. Further, a bond portion of the first bond electrodes 14 and the second bond electrodes 44 is sealed with a sealing resin 18.

For the image pickup apparatus 1, a distal end portion of the second main surface 40SB of the wiring board 40 and the opposite surface 10SB of the image pickup device 10, the second main surface 40SB of the wiring board 40 and the opposite surface 10SB of the image pickup device 10 arranged in parallel, are fixed by the plurality of bumps 15. Therefore, the image pickup apparatus 1 has a low risk of being damaged when handled during manufacture, is easy to manufacture, and is inexpensive because of a high yield.

Note that, in the image pickup apparatus 1, the image pickup device 10 is a five 5-terminal element, composed to five of the light receiving surface electrodes 12. Five extended wiring patterns 13 are provided. In contrast, there are nine, each, of the first bond electrodes 14 and the second bond electrodes 44 arranged both in the grid pattern are provided. That is, four first bond electrodes 14 and the four second bond electrodes 44 are provided as so-called dummy electrodes that are not electrically needed or meaningless.

As illustrated in FIG. 2, the five first bond electrodes 14 like a first bond electrode 14A connected with one extended wiring pattern 13 are normal electrodes.

In contrast, the four first bond electrodes 14 like a first bond electrode 14B not connected with one extended wiring pattern 13 are the dummy electrodes.

The image pickup device 10 includes the four dummy electrodes 14B or the like not electrically connected with the light receiving surface electrodes 12 on the opposite surface 10SB, and the dummy electrodes are respectively bonded with the four second bond electrodes 44B or the like. Further, the five first bond electrodes 14A or the like connected with the extended wiring pattern 13 are electrically connected with the five second bond electrodes 44A or the like respectively. Note that the dummy electrode may be connected to one extended wiring pattern 13, however, the second bond electrode 44 bonded with such a dummy electrode does not need to be electrically connected with the signal cable 50 or the like.

The dummy electrodes of the first bond electrodes 14 are disposed in order to more strongly fix the wiring board 40 and the image pickup device 10.

In particular, since the wiring board 40 and the image pickup device 10 are more strongly fixed, the image pickup apparatus 1 including the first bond electrodes 14 and the second bond electrodes 44 (44C) arranged in the grid pattern is not damaged when handled during the manufacture so that the yield is high.

In addition, the wiring board 40 is bent at the rear end portion not joined with the image pickup device 10. Therefore, in a plane view from a thickness direction of the image pickup device 10, the entire wiring board 40 is arranged in an area on an inner side of the image pickup device 10, that is, within the projection surface of the image pickup device 10. The wiring board 40 may be a non-flexible substrate formed of a glass epoxy resin or the like, however, when a length is long, at least a bending area needs to be flexible in order to house the wiring board 40 within the projection surface of the image pickup device 10.

Since the wiring board 40 and the signal cable 50 are not projected to an outer side of an outer shape of the image pickup device 10, the image pickup apparatus 1 has a narrow diameter.

Note that, when the length of the wiring board 40 is short, it is needless to say that the wiring board 40 can be housed within the projection surface of the image pickup device 10 even when the wiring board 40 is the non-flexible wiring board.

In addition, the distal end portion of the wiring board 40 may be joined with the almost entire opposite surface 10SB of the image pickup device 10, or a bending angle may be an obtuse angle when the wiring board 40 can be housed within the projection surface of the image pickup device 10. Further, for the wiring board 40, not only a bond end portion with the image pickup device 10 is bent but also the rear end portion may be bent further.

Second Embodiment

Next, an image pickup apparatus 1A in a modification of a second embodiment will be described. Since the image pickup apparatus 1A is similar to the image pickup apparatus 1, same signs are attached to components of same functions and description is omitted. In addition, in FIG. 5, the illustrations of the wiring board or the like are omitted.

Figure 5:
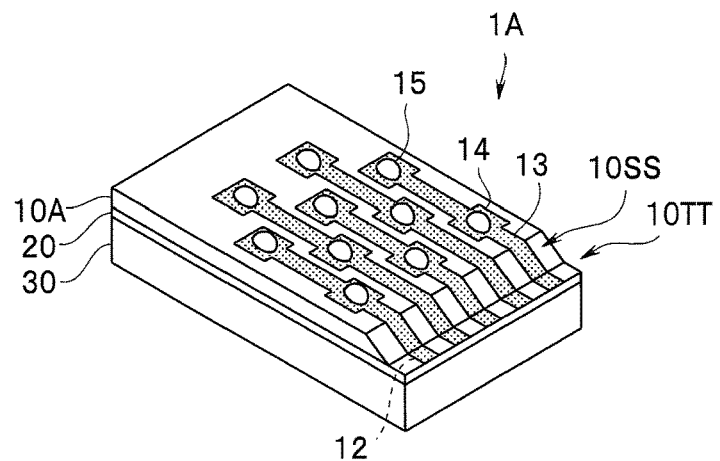
FIG. 5 is a partial perspective view of the image pickup apparatus in a second embodiment.

As illustrated in FIG. 5, in the image pickup device 10A of the image pickup apparatus 1A, differently from the image pickup device 10, the inclined surface LOSS inclined at the first angle θ1 to the light receiving surface 10SA is the wall surface against the notch 10TT, not against the through trench (10T). That is, in the case in which cutting line for time of cutting the bond wafer is on the bottom surface of the through trench, the through trench becomes the notch 10TT by cutting.

In addition, in the image pickup device 10A, in two of the extended wiring patterns 13 adjacent to each other, the first bond electrodes 14 are alternately arranged in the longitudinal direction. The second bond electrodes corresponding to the first bond electrodes 14 are also alternately arranged.

Then, the first bond electrode 14 is a part of the extended wiring pattern 13 which is wide in the extended wiring pattern 13. That is, the first bond electrode 14 is configured from the same material as the extended wiring pattern 13.

The image pickup apparatus 1A has effects of the image pickup apparatus 1. In addition, when bonding the first bond electrode 14 and the second bond electrode of the wiring board not illustrated, there is no risk that the extended wiring patterns 13 adjacent to each other are short-circuited, and the yield of the image pickup apparatus 1A is higher than the yield of the image pickup apparatus 1.

Third Embodiment

Next, an image pickup apparatus 1B in a modification of a third embodiment will be described. Since the image pickup apparatus 1B is similar to the image pickup apparatuses 1 and 1A, the same signs are attached to the components of the same functions and the description is omitted.

Figure 6:
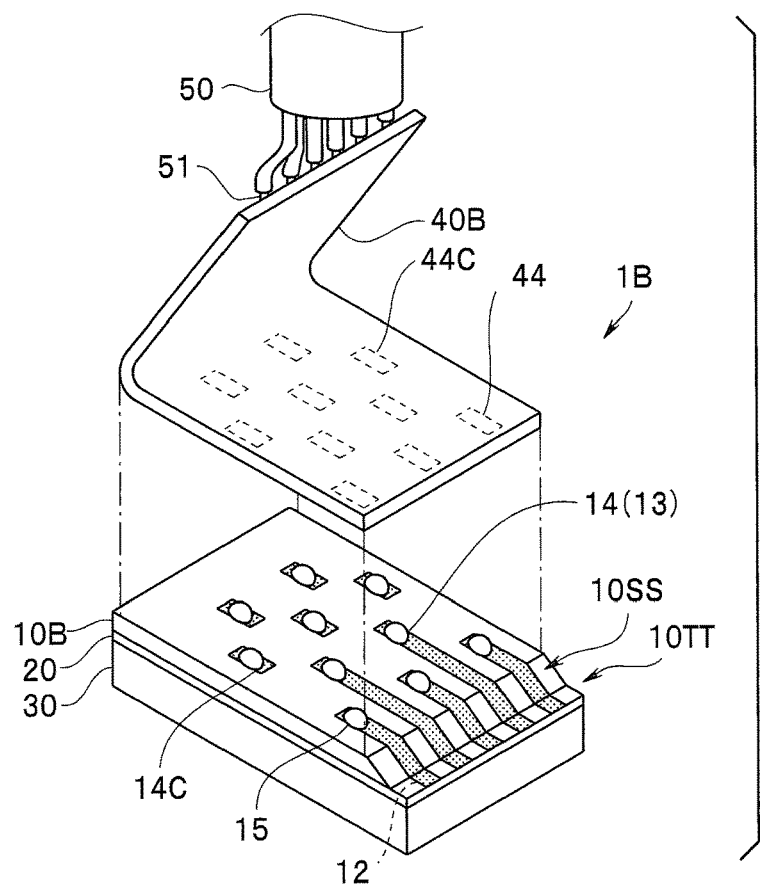
FIG. 6 is an exploded view of the image pickup apparatus in a third embodiment.

As illustrated in FIG. 6, in the image pickup apparatus 1B, an end portion of the extended wiring pattern 13 of the image pickup device 10B configures the first bond electrode 14. In addition, to the image pickup apparatus 1B, in addition to the first bond electrodes 14, the first bond electrodes 14C which are the dummy electrodes are disposed. Then, of the plurality of second bond electrodes 44 of a wiring board 40B, second bond electrodes 44C opposing the first bond electrodes 14C are bonded with the first bond electrodes 14C.

The image pickup apparatus 1B includes, in addition to the first bond electrodes 14 bonded with the extended wiring patterns 13, the first bond electrodes 14C which are the dummy electrodes. In addition, the first bond electrodes 14 and 14C and the second bond electrodes 44 (44C) are arranged in the grid pattern. Further, in two of the extended wiring patterns 13 adjacent to each other, the first bond electrodes 14 are alternately arranged in the longitudinal direction.

Since the wiring board 40B and the image pickup device 10B are strongly fixed, the image pickup apparatus 1B is not damaged when handled during the manufacture so that the yield is high.

The present invention is not limited to the embodiments, the modifications and the like described above, and can be variously changed, modified, combined or the like without changing a subject matter of the present invention.

What is claimed is:

1. An image pickup apparatus comprising:
   an image pickup device including a light receiving surface where a light receiving portion is formed, an opposite surface opposing the light receiving surface, and an inclined surface inclined at an acute first angle to the light receiving surface, the image pickup device being provided with a plurality of light receiving surface electrodes electrically connected with the light receiving portion, the plurality of light receiving surface electrodes being formed on the light receiving surface;

a transparent member joined so as to cover the light receiving surface; and a wiring board including a plurality of second bond electrodes disposed on a main surface, wherein the transparent member and the plurality of light receiving surface electrodes are extended to an outside of an end side of the inclined surface, and back surfaces of the plurality of light receiving surface electrodes are exposed from a side of the opposite surface, the image pickup device includes a plurality of extended wiring patterns disposed on the opposite surface, the plurality of extended wiring patterns being electrically connected to respective back surfaces of the plurality of light receiving surface electrodes, the plurality of extended wiring patterns extending from the plurality of light receiving surface electrodes through the inclined surface and to the opposite surface, each of the extended wiring patterns including a first bond electrode on the opposite surface, and the main surface of the wiring board and the opposite surface of the image pickup device are arranged in parallel, and the first bond electrode and each of the plurality of second bond electrodes are bonded through a bump to electrically connect the first bond electrodes to the second bond electrodes and to mechanically connect the wiring board to the image pickup device.

2. The image pickup apparatus according to claim 1, wherein the bump is a solder bump.

3. The image pickup apparatus according to claim 2, wherein the image pickup device includes a dummy electrode, not electrically connected with the light receiving surface electrodes, on the opposite surface, and one of the plurality of second bond electrodes is bonded with the dummy electrode.

4. The image pickup apparatus according to claim 2, wherein one of the first bond electrodes is electrically connected with another of the first bond electrodes through the extended wiring patterns.

5. The image pickup apparatus according to claim 1, wherein the plurality of second bond electrodes are arranged in a grid pattern.

6. The image pickup apparatus according to claim 1, wherein, in two of the extended wiring patterns adjacent to each other, the first bond electrodes are alternately arranged in the longitudinal direction.

7. The image pickup apparatus according to claim 1, wherein the wiring board is a flexible wiring board having a rear end portion, and the rear end portion is bent in an area where the plurality of second bond electrodes are disposed.

* * * * *